(12) United States Patent
Lu

(10) Patent No.: US 11,088,101 B2
(45) Date of Patent: Aug. 10, 2021

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/443,574

(22) Filed: Jun. 17, 2019

(65) Prior Publication Data
US 2020/0395327 A1 Dec. 17, 2020

(51) Int. Cl.
H01L 23/485 (2006.01)
H01L 23/00 (2006.01)
H01L 21/768 (2006.01)
H01L 23/31 (2006.01)

(52) U.S. Cl.
CPC ........ *H01L 24/17* (2013.01); *H01L 21/76871* (2013.01); *H01L 21/76877* (2013.01); *H01L 23/3185* (2013.01); *H01L 24/08* (2013.01); *H01L 24/32* (2013.01); *H01L 24/73* (2013.01); *H01L 24/97* (2013.01); *H01L 2224/175* (2013.01); *H01L 2224/325* (2013.01); *H01L 2224/73203* (2013.01); *H01L 2924/35121* (2013.01)

(58) Field of Classification Search
None
See application file for complete search history.

(56) References Cited

U.S. PATENT DOCUMENTS

| | | | | |
|---|---|---|---|---|
| 9,661,756 B1* | 5/2017 | Nguyen | ................ | H01L 24/65 |
| 2004/0238953 A1* | 12/2004 | Murtuza | ............... | H05K 1/111 |
| | | | | 257/737 |
| 2009/0196011 A1* | 8/2009 | Kobayashi | ........ | H01L 23/49816 |
| | | | | 361/820 |
| 2010/0052164 A1* | 3/2010 | Lee | ......................... | H01L 24/03 |
| | | | | 257/738 |
| 2013/0075907 A1* | 3/2013 | Pang | ...................... | H01L 24/11 |
| | | | | 257/741 |
| 2016/0013133 A1* | 1/2016 | Gu | ...................... | H01L 23/5222 |
| | | | | 257/758 |
| 2017/0025381 A1* | 1/2017 | Tsai | ........................ | H01L 24/80 |

\* cited by examiner

Primary Examiner — Benjamin P Sandvik
(74) Attorney, Agent, or Firm — Foley & Lardner LLP

(57) ABSTRACT

A semiconductor package structure includes a semiconductor die having an active surface, a conductive bump electrically coupled to the active surface, and a dielectric layer surrounding the conductive bump. The conductive bump and the dielectric layer form a planar surface at a distal end of the conductive bump with respect to the active surface. The distal end of the conductive bump is wider than a proximal end of the conductive bump with respect to the active surface.

8 Claims, 24 Drawing Sheets

SEMICONDUCTOR PACKAGE STRUCTURE AND METHOD OF MANUFACTURING THE SAME

BACKGROUND

1. Technical Field

The present disclosure relates to a semiconductor package structure. In particular, the present disclosure relates to a semiconductor package structure including direct bonding features.

2. Description of the Related Art

As miniaturization of semiconductor device packages progresses, the densities of metal wiring and conductive pads are increased to cater the criteria of high I/O density products. However, solder bridging and underfill gap may be presented in such device package miniaturization.

A direct bonding technique, such as hybrid bonding, may solve the above problems. However, crack or delamination may occur in the semiconductor device package when using the direct bonding technique.

SUMMARY

In some embodiments, according to one aspect of the present disclosure, a semiconductor package structure includes a semiconductor die having an active surface, a conductive bump electrically coupled to the active surface, and a dielectric layer surrounding the conductive bump. The conductive bump and the dielectric layer form a planar surface at a distal end of the conductive bump with respect to the active surface. The distal end of the conductive bump is wider than a proximal end of the conductive bump with respect to the active surface.

In some embodiments, according to one aspect of the present disclosure, a semiconductor package structure includes a semiconductor die having an active surface and a substrate having a bonding surface. The semiconductor die comprises a first conductive bump electrically coupled to the active surface and a first dielectric layer surrounding the first conductive bump. A distal end of the first conductive bump is wider than a proximal end of the conductive bump with respect to the active surface. The substrate comprises a second conductive bump connected to the first conductive bump at the bonding surface and a second dielectric layer surrounding the second conductive bump. A distal end of the second conductive bump is narrower than a proximal end of the second conductive bump with respect to the bonding surface.

In some embodiments, according to another aspect of the present disclosure, a method is disclosed for manufacturing a semiconductor device package. The method includes: providing a semiconductor wafer having an active surface; forming a conducive pattern on the active surface; forming a dielectric layer over the active surface; and patterning the dielectric layer. The operation of patterning the dielectric layer comprises: exposing a portion of the conductive pattern by a lithography operation; and trimming the dielectric layer thereby forming a first radius of curvature in proximity to a surface of the dielectric layer distal to the active surface.

BRIEF DESCRIPTION OF THE DRAWINGS

Aspects of the present disclosure are readily understood from the following detailed description when read with the accompanying figures. It should be noted that various features may not necessarily be drawn to scale. In fact, the dimensions of the various features may be arbitrarily increased or reduced for clarity of discussion.

DETAILED DESCRIPTION

Figure 1:
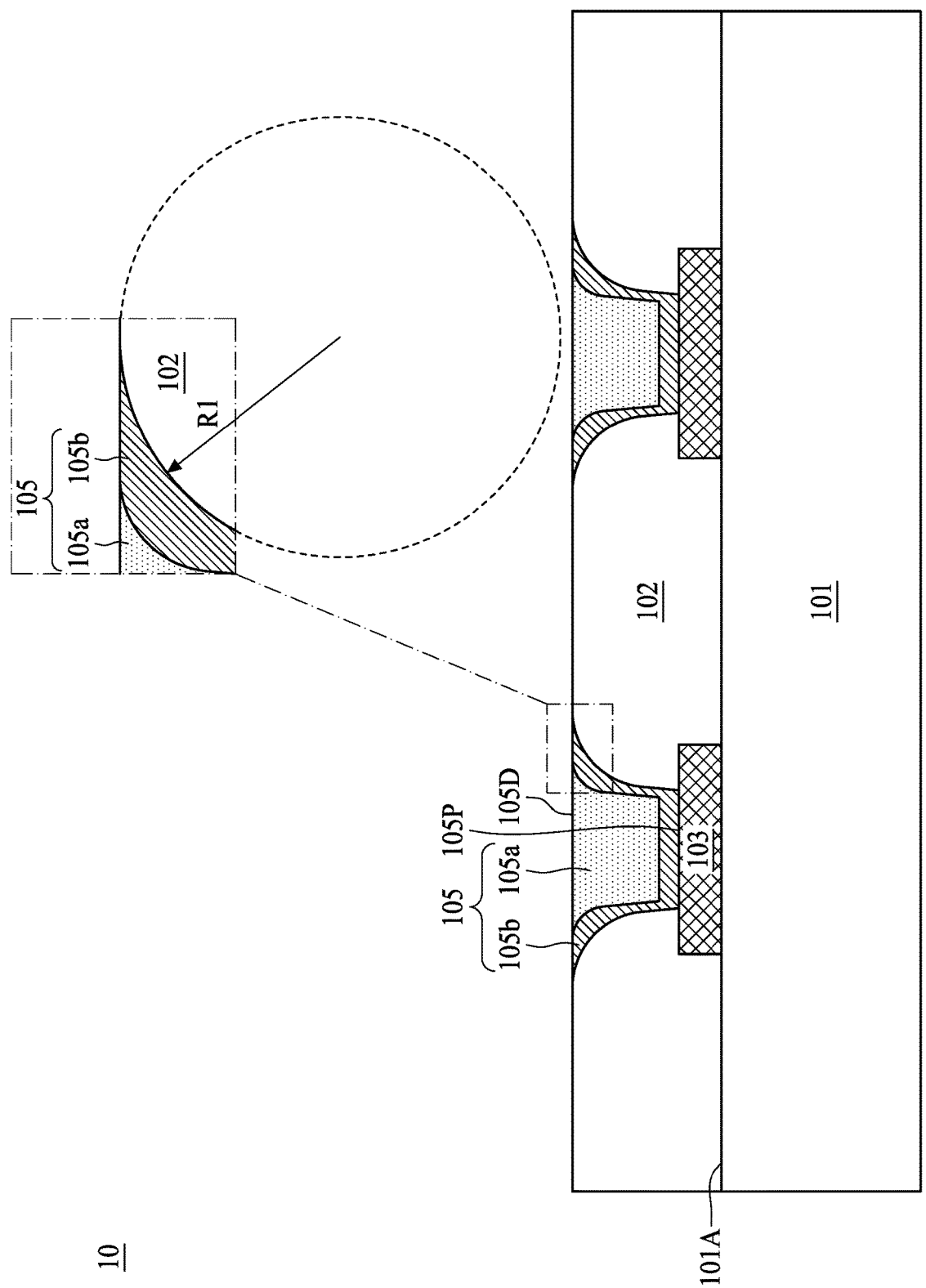
FIG. 1 illustrates a cross-sectional view of a semiconductor package structure according to some embodiments of the present disclosure.

Common reference numerals are used throughout the drawings and the detailed description to indicate the same or similar components.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

As previously discussed, solder bridging and underfill gap may be presented in such device package miniaturization. For example, current 2.5D, 3D, and/or fan-out packages fail to meet the criteria of high I/O density product due to the constraint of soldering technique. A bonding pitch in comparative soldering technique takes up from 30 μm to 40 μm, and solder bump bridging would occur when the bonding pitch decreases to lower than 30 μm. Filling underfill material into a space between semiconductor die and underlying carrier may also be hindered due to reduced dimension, for example, at least a 30 μm separation between the semiconductor die and carrier is specified to introduce underfill material into the space. Direct bonding, for example, hybrid bonding, may effectively adapt to the device package miniaturization. However, ultrasonic bonding operation used in hybrid bonding often causes cracks between metal-non metal interface and generate product yield loss. In some comparative embodiments, metal-non metal interface may be a boundary vertical to semiconductor device package surface. During ultrasonic bonding operation, a force parallel to semiconductor device package surface, or perpendicular to the metal-non metal interface, is applied to the semiconductor device package, and causing cracks or delamination at the metal-non metal interface.

The present disclosure provides a hybrid bonding package structure which meets the criteria of high I/O density while at the same time reducing crack or delamination from occurring during the process of ultrasonic bonding operation in some comparative hybrid bonding package structure.

FIG. 1 is a cross-sectional view of a semiconductor package structure 10 in accordance with some embodiments of the present disclosure. The semiconductor package structure 10 includes a semiconductor die 101, a dielectric layer 102, and a conductive bump 105.

The semiconductor die 101 has an active surface 101A. The semiconductor die 101 includes a conductive pad 103 in proximity to, adjacent to, or embedded in and exposed at the active surface 101A. The conductive pad 103 may include Au, Ag, Cu, Pt, Pd, alloy of the same, or other suitable materials.

The conductive pad 103 is bonded to the conductive bump 105. The conductive bump 105 is electrically coupled to the active surface 101A of the semiconductor die 101. The conductive bump 105 includes a bonding layer 105a and a seed layer 105b. The bonding layer 105a is surrounded by the seed layer 105b. The bonding layer 105a may include Au, Ag, Cu, Pt, Pd, alloy of the same, or other suitable materials. The seed layer 105b may include Ni, Ti, W, alloy of the same, or other suitable materials. The conductive bump 105 may include electroplated copper or nano-copper. The conductive bump 105 is surrounded by the dielectric layer 102. The seed layer 105b is disposed between the conductive bump 105 and the dielectric layer 102. The seed layer 105b may enhance adhesive between the conductive bump 105 and the dielectric layer 102. The dielectric layer 102 may include organic materials or inorganic materials. The organic materials may be Bismaleimide-triazine (BT), Ajinomoto Build-up Film (ABF), Polyimide (PI), epoxy using photosensitive, non-photosensitive liquid, or dry-film. The inorganic materials may be oxidation materials (e.g. SiOx, SiNx, TaOx), glass, silicon, or ceramic.

The conductive bump 105 and the dielectric layer 102 form a planar surface at a distal end 105D of the conductive bump 105 with respect to the active surface 101A of the semiconductor die 101. The distal end 105D of the conductive bump 105 is wider than a proximal end 105P of the conductive bump 105 with respect to the active surface 101A of the semiconductor die 101. A side wall of the conductive bump 105 is curved. A boundary of the conductive bump 105 and the dielectric layer 102 is curved. In some embodiments, a boundary of the conductive bump 105 and the dielectric layer 102 at the distal end 105D is curved. A boundary of the conductive bump 105 and the dielectric layer 102 at the proximal end 105P is curved. A boundary of the conductive bump 105 and the dielectric layer 102 at the distal end 105D may include a radius of curvature R1.

In some embodiments, the interface between the conductive bump 105 and the dielectric layer 102 is curved (hereinafter "curved interface") and possessing a measurable radius of curvature. Therefore, during an ultrasonic bonding operation, when a horizontal force is applied to the curved interface, such force would be dispersed at the curved interface due to the fact that the direction of the force is not perpendicular to the curved interface. In some comparative embodiments, when the interface between the conductive bump 105 and the dielectric layer 102 is vertical (hereinafter "vertical interface") or perpendicular to the force exerted thereon, the vertical interface receives the most concentrated impact from the horizontal force, and thereby generating cracks or delaminations. Alternatively stated, the structure of curved interface could better prevent crack or delamination from occurring at the interface between the conductive bump 105 and the dielectric layer 102 compared to the vertical interface.

Figure 2:
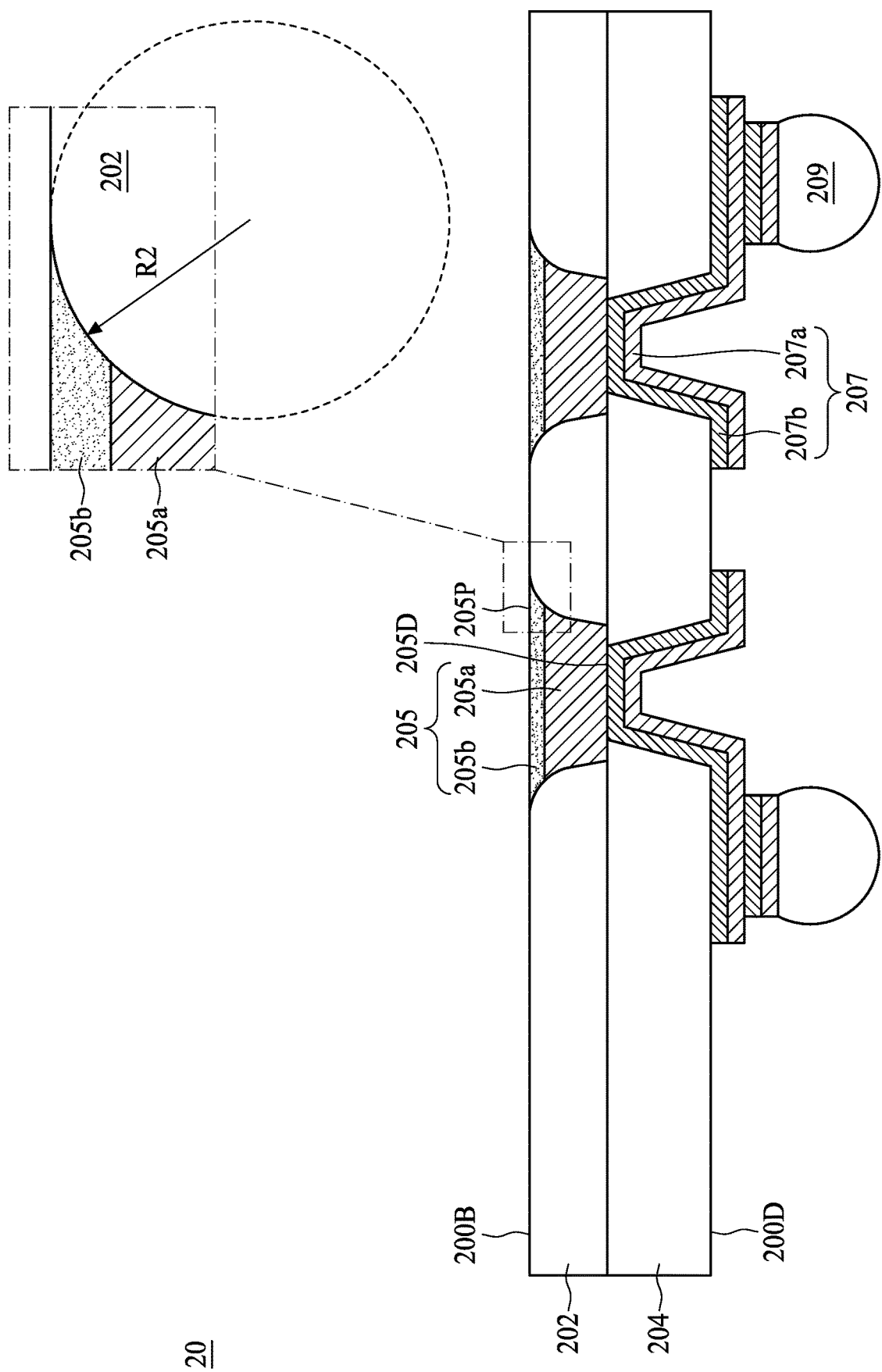
FIG. 2 illustrates a cross-sectional view of a package substrate according to some embodiments of the present disclosure.

FIG. 2 is a cross-sectional view of a package substrate 20 in accordance with some embodiments of the present disclosure. The package substrate 20 is used for packaging a semiconductor device or semiconductor package structure. The package substrate 20 includes a dielectric layer 202, a dielectric layer 204, a conductive bump 205, an interconnection element 207, and a solder ball 209. The package substrate 20 has a bonding surface 200B and a back side surface 200D opposite to the bonding surface 200B. The back side surface 200D may be a conductive terminal surface.

The dielectric layer 202 is disposed on the dielectric layer 204. The dielectric layer 202 surrounds the conductive bump 205. The interconnection element 207 penetrates the dielectric layer 204 to electrically connect the conductive bump 205 to the solder ball 209. The solder ball 209 may be formed as a fan-in structure or a fan-out structure. The solder ball 209 may be replaced with ball grid array (BGA), C4, land grid array (LGA), or a bump structure. The interconnection element 207 includes a conductive layer 207a and a seed layer 207b. The solder ball 209 is disposed on a backside of the dielectric layer 204. The dielectric layer 202 or the dielectric layer 204 may include organic materials or inorganic materials. The organic materials may be BT, ABF, PI, epoxy using photosensitive, non-photosensitive liquid, or dry-film. The inorganic materials may be oxidation materials (e.g. SiOx, SiNx, TaOx), glass, silicon, or ceramic.

The conductive bump 205 includes a conductive layer 205a and a bonding layer 205b. The conductive layer 205a may include Au, Ag, Cu, Pt, Pd, alloy of the same, or other suitable materials. The bonding layer 205b in proximity to a proximal end 205P of the conductive bump 205 with respect to the bonding surface 200B may include Cu, Au, Al, Ag, Pt, Pd, or other suitable materials. The bonding layer 205b may include nano-copper or copper with finer grains than that in the conductive layer 205a. The bonding layer 205b may enhance bonding ability of the conductive bump 205.

A distal end 205D of the conductive bump 205 is narrower than a proximal end 205P of the conductive bump 205 with respect to the bonding surface 200B. The conductive layer 205a is in proximity to the distal end 205D of the second conductive bump. The bonding layer 205b is in proximity to the proximal end 205P of the conductive bump 205. A side wall of the conductive bump 205 is curved. A boundary of the conductive bump 205 and the dielectric layer 202 is curved. In some embodiments, a boundary of the conductive bump 205 and the dielectric layer 202 at the distal end 205D is curved. A boundary of the conductive bump 205 and the dielectric layer 202 at the proximal end 205P is curved. A boundary of the conductive bump 205 and the dielectric layer 202 at the proximal end 205P comprises a radius of curvature R2. The conductive bump 205 and the dielectric layer 202 form a planar surface at the proximal end 205P of the conductive bump 205.

In some embodiments, the interface between the conductive bump 205 and the dielectric layer 202 is curved (hereinafter "curved interface") and possessing a measurable radius of curvature. Therefore, during an ultrasonic bonding operation, when a horizontal force is applied to the curved interface, such force would be dispersed at the curved interface due to the fact that the direction of the force is not perpendicular to the curved interface. In some comparative embodiments, when the interface between the conductive bump 205 and the dielectric layer 202 is vertical (hereinafter "vertical interface") or perpendicular to the force exerted thereon, the vertical interface receives the most concentrated impact from the horizontal force, and thereby generating cracks or delaminations. Alternatively stated, the structure of curved interface could better prevent crack or delamination from occurring at the interface between the conductive bump 205 and the dielectric layer 202 compared to the vertical interface. Even in a final packaged product, a horizontal force may be generated from outside.

Figure 3:
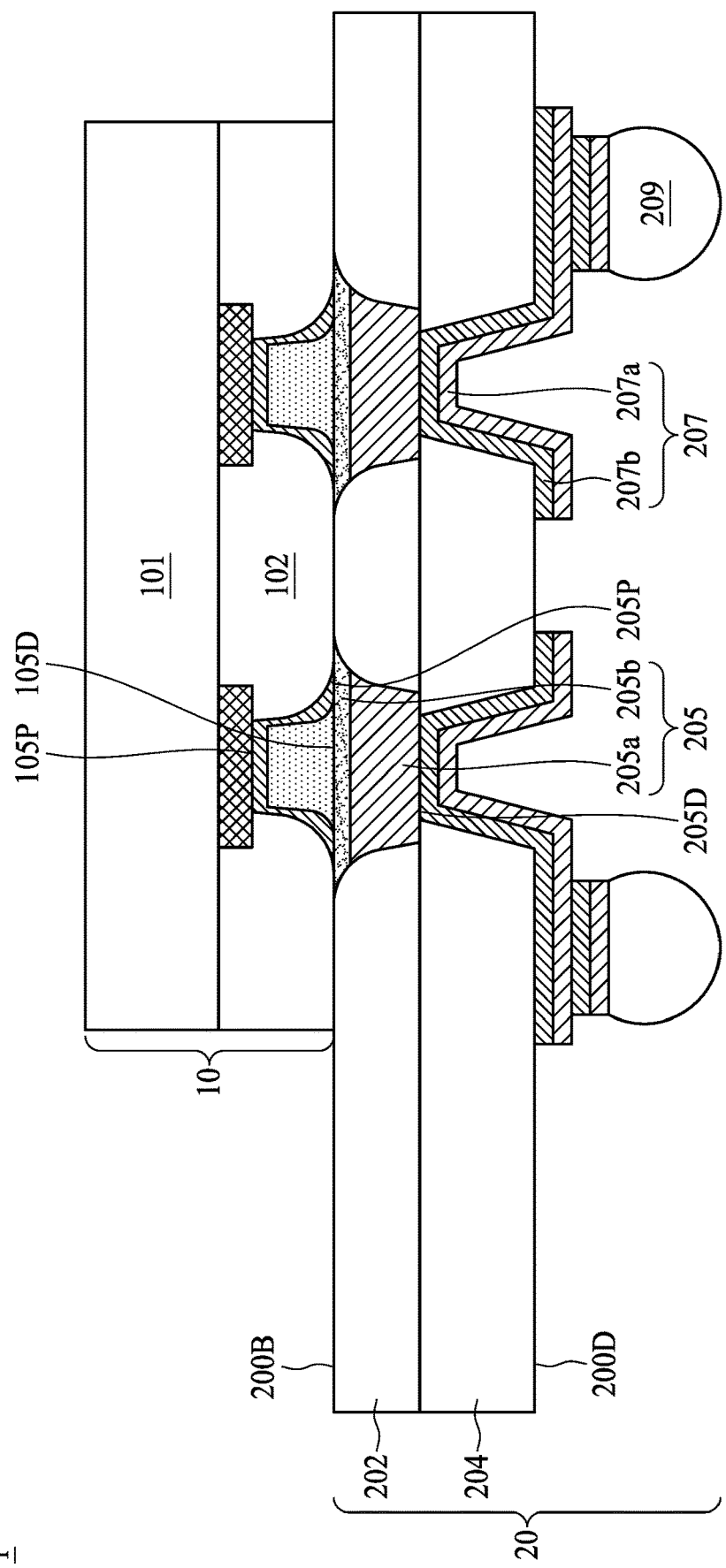
FIG. 3 illustrates a cross-sectional view of a semiconductor package structure according to some embodiments of the present disclosure.

FIG. 3 is a cross-sectional view of a semiconductor package structure 1 in accordance with some embodiments of the present disclosure. The semiconductor package structure 1 includes the semiconductor package structure 10 and the package substrate 20. The semiconductor package structure 10 is disposed on the package substrate 20. The dielectric layer 102 of the semiconductor package structure 10 is in contact with the dielectric layer 202 of the package substrate 20. The package substrate 20 is hybrid bonded to the semiconductor die 101 of the semiconductor package structure 10. The active surface 101A of the semiconductor die 101 faces toward the bonding surface 200B of the package substrate 20.

The conductive bump 205 of the package substrate 20 is electrically connected to the conductive bump 105 of the semiconductor package structure 10 at the bonding surface 200B. The conductive bump 205 of the package substrate 20 is in contact with the conductive bump 105 of the semiconductor package structure 10. The conductive bump 205 of the package substrate 20 is in contact with the dielectric layer 102 of the semiconductor package structure 10. The bonding layer 205b of the conductive bump 205 is in contact with the conductive bump 105 and the dielectric layer 102. A size of the conductive bump 205 is greater than a size of the conductive bump 105. A width of the conductive bump 205 at the proximal end 205P is wider than a width of the conductive bump 105 at the distal end 105D. In such structure, the semiconductor package structure 10 would be stably bonded on the package substrate 20 without crack or delamination.

The semiconductor package structure 1 is a single redistribution layer (RDL) connection structure. In some embodiments, the semiconductor package structure 1 may be modified as a multilayer inner RDLs connection structure. The semiconductor package structure 1 may include a plurality of semiconductor package structures 10 on the package substrate 20.

Figure 4:
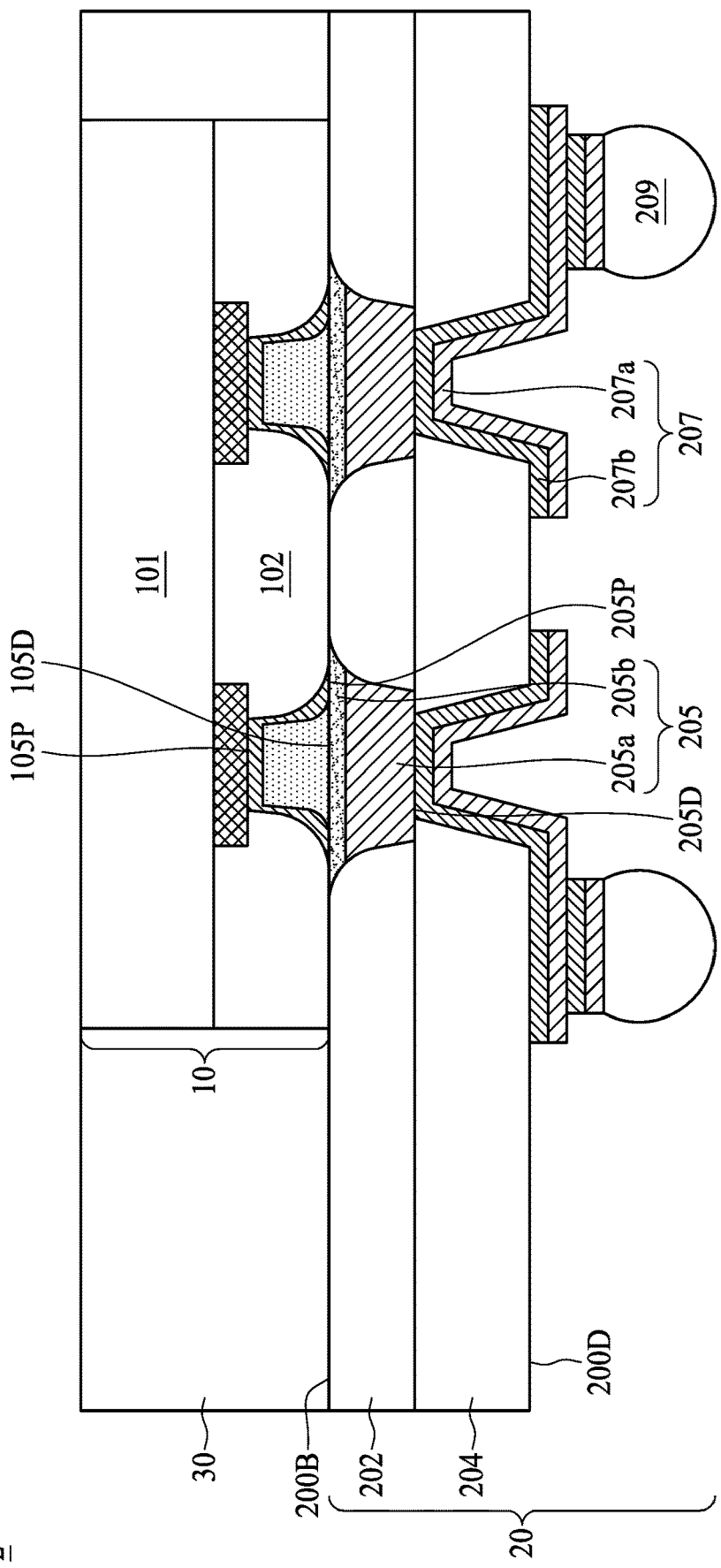
FIG. 4 illustrates a cross-sectional view of a semiconductor package structure according to some embodiments of the present disclosure.

FIG. 4 is a cross-sectional view of a semiconductor package structure 2 in accordance with some embodiments of the present disclosure. The semiconductor package structure 2 is similar to the semiconductor package structure 1 in FIG. 3 except that the semiconductor package structure 2 includes an encapsulant 30.

The semiconductor package structure 10 is encapsulated by the encapsulant 30. A backside of the semiconductor die 101 of the semiconductor package structure 10 is exposed by the encapsulant 30. The bonding surface 200B of the package substrate 20 is completely encapsulated by the encapsulant 30. In some embodiments, the bonding surface 200B of the package substrate 20 is partially encapsulated by the encapsulant 30. The encapsulant 30 may completely encapsulate the semiconductor package structure 10.

Figure 5B:
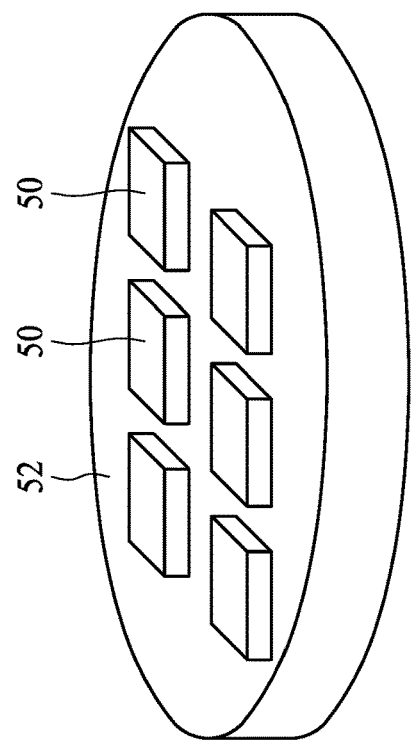
FIG. 5B illustrates a type of a carrier for semiconductor package structures in accordance with some embodiments of the present disclosure.
Figure 5A:
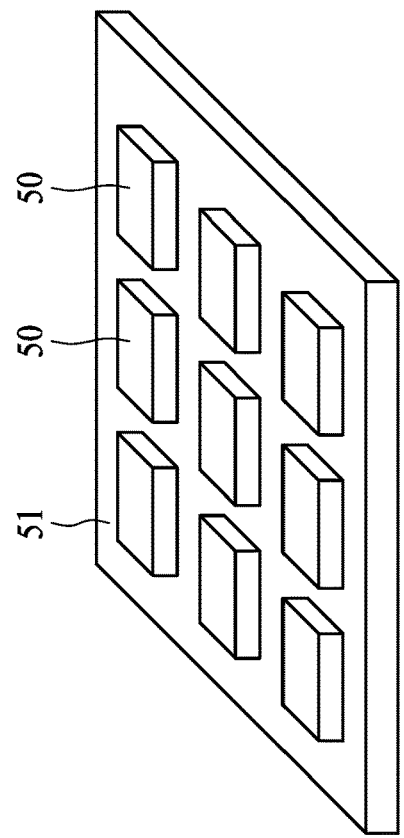
FIG. 5A illustrates a type of a carrier for semiconductor package structures in accordance with some embodiments of the present disclosure.

FIG. 5A shows a type of a carrier for semiconductor package structures in accordance with some embodiments of the present disclosure.

As shown in FIG. 5A, a plurality of semiconductor devices 50 or dies are placed on a substantially square-shaped carrier 51 (e.g. in accordance with one or more embodiments described herein). In some embodiments, the carrier 51 may include organic materials (e.g., a molding compound, BT, a PI, PBO, a solder resist, an ABF, a polypropylene (PP) or an epoxy-based material) and/or inorganic materials (e.g., silicon, glass, ceramic or quartz).

FIG. 5B shows another type of a carrier for semiconductor package structures in accordance with some embodiments of the present disclosure.

As shown in FIG. 5B, a plurality of semiconductor devices 50 or dies are placed on a substantially circle-shaped carrier 52 (e.g. in accordance with one or more embodiments described herein). In some embodiments, the carrier 52 may include organic materials (e.g., a molding compound, BT, a PI, PBO, a solder resist, an ABF, a PP or an epoxy-based material) and/or inorganic materials (e.g., silicon, glass, ceramic or quartz).

FIG. 6A through FIG. 6K illustrate some embodiments of a method of manufacturing a package substrate 20 according to some embodiments of the present disclosure. Various figures have been simplified to more clearly present aspects of the present disclosure.

Figure 6A:
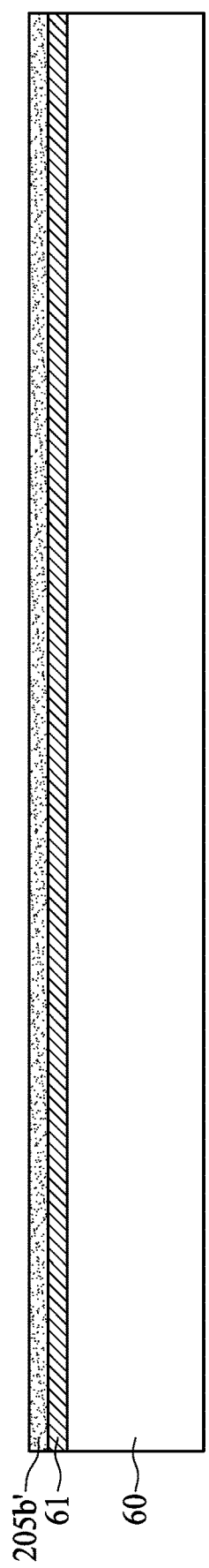
FIG. 6A, FIG. 6B, FIG. 6C, FIG. 6D, FIG. 6E, FIG. 6F, FIG. 6G, FIG. 6H, FIG. 6I, FIG. 6J, and FIG. 6K illustrate intermediate operations of a method for manufacturing a package substrate according to some embodiments of the present disclosure.

Referring to FIG. 6A, the method for manufacturing the package substrate 20 includes providing a carrier 60. An adhesive layer 61 is applied on the carrier 60. A bonding layer 205b' is formed on the adhesive layer 61. In some embodiments, the bonding layer 205b' may include electroplated copper. In some embodiments, the bonding layer 205b' may be formed by a physical vapor deposition (PVD) operation, such as a sputtering operation. In some embodiments, the bonding layer 205b' may be formed by a printing operation including copper ball and fillers. In some embodiments, the bonding layer 205b' may be a single or a multiple layers. Each of the multiple layers may be formed by different techniques including, but not limited to, the aforementioned.

Figure 6B:
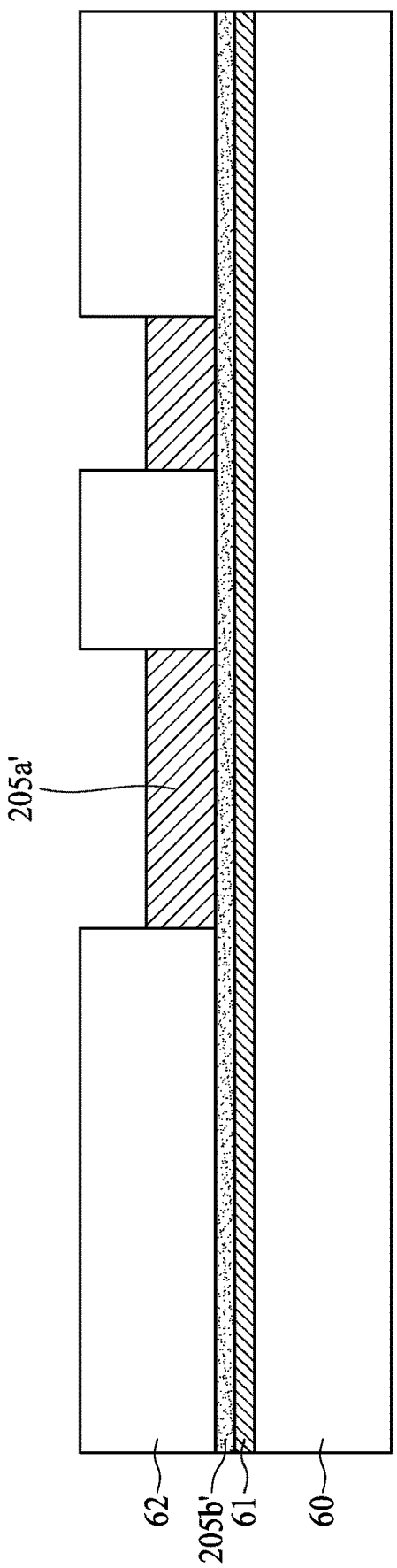

Referring to FIG. 6B, a photoresist 62 is applied on the bonding layer 205b'. The photoresist 62 is used as a masking layer. Subsequently, the photoresist 62 is patterned over the bonding side to form a plurality of openings by a photolithographic operation. A conductive material is filled in the openings by an electroplating operation to form a conductive layer 205a'. In some embodiments, the conductive layer 205a' includes electroplated copper. In some embodiments, the conductive layer 205a' can be formed by sputtering operation or printing operation, as previously mentioned in the formation of the bonding layer 205b'.

Figure 6C:
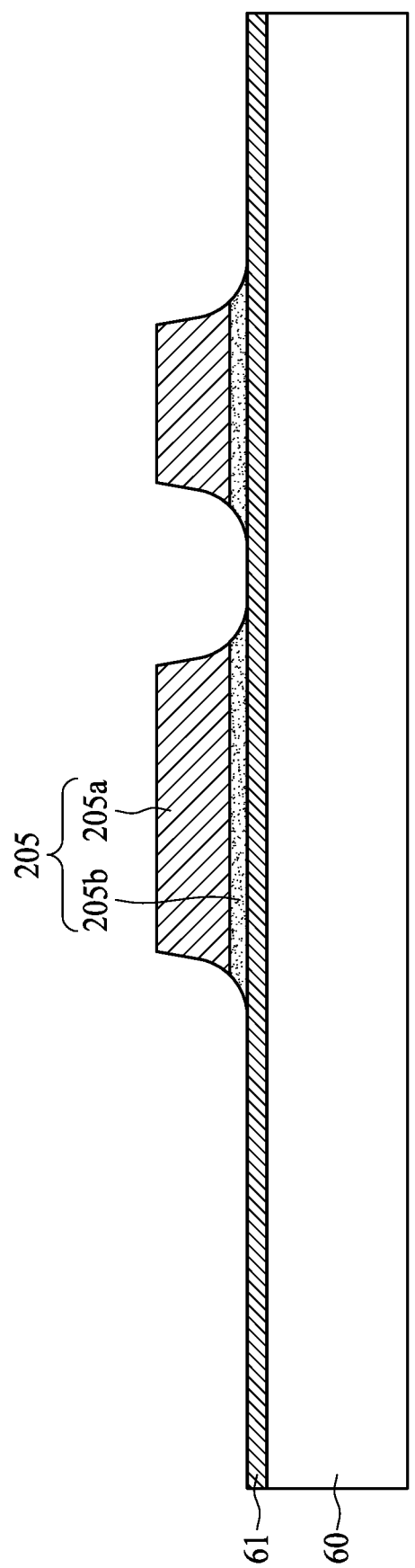

Referring to FIG. 6C, the photoresist 62 is removed and exposing a sidewall of the conductive layer 205a'. Subsequently, the conductive layer 205a' and the bonding layer 205b' are trimmed to form a conductive pattern 205 having an under-etching feature. The etching duration of the etching operation may be controlled as long as the desired under-etching feature is obtained. By having an under-etching feature, the conductive pattern 205 has a wider bottom portion and a narrower top portion. The conductive pattern 205 includes a conductive layer 205a and a bonding layer 205b. The conductive pattern 205 has a curved sidewall.

In some embodiments, etching recipe used in the etching operation may be adjusted to form different radius of curvature at the sidewall of the conductive pattern 205. For example, when 25 minutes, a greater radius of curvature 1.75 μm can be obtained. When 1 minute, a smaller radius of curvature 0.52 μm can be obtained.

Figure 6D:
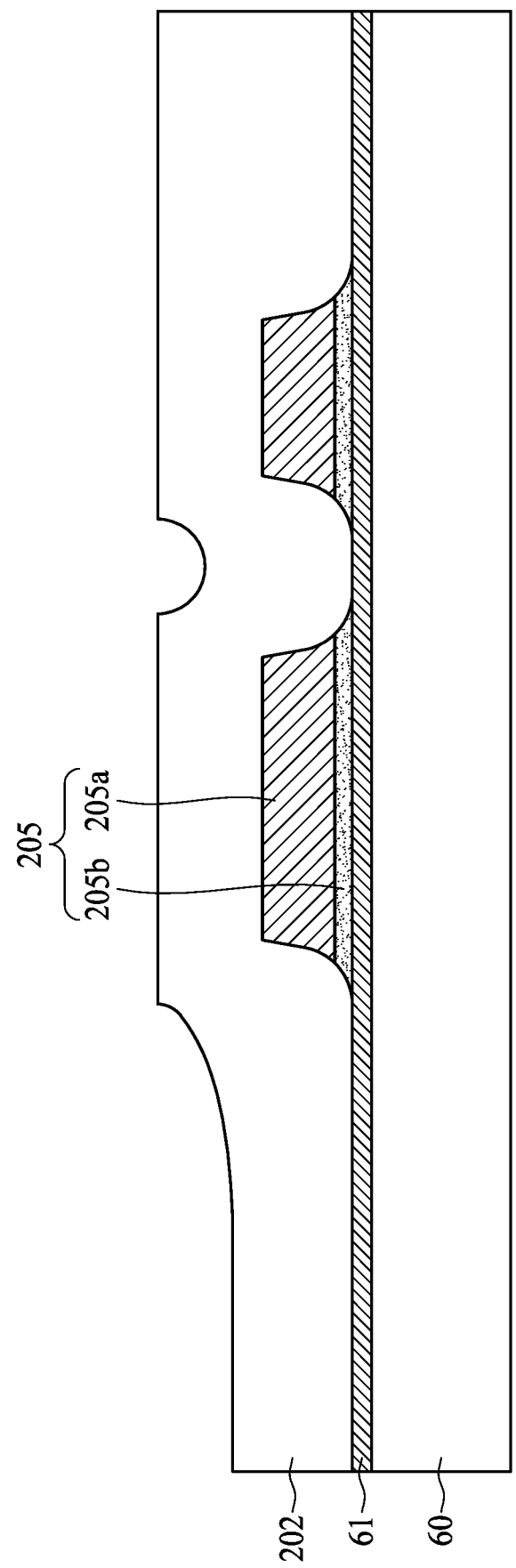

Referring to FIG. 6D, a dielectric layer 202 is conformally formed over the carrier 60 and covering the conductive pattern 205. As shown in FIG. 6D, a top surface of the dielectric layer 202 follows an underlying morphology of the conductive pattern 205 and may not be a flat surface.

Figure 6E:
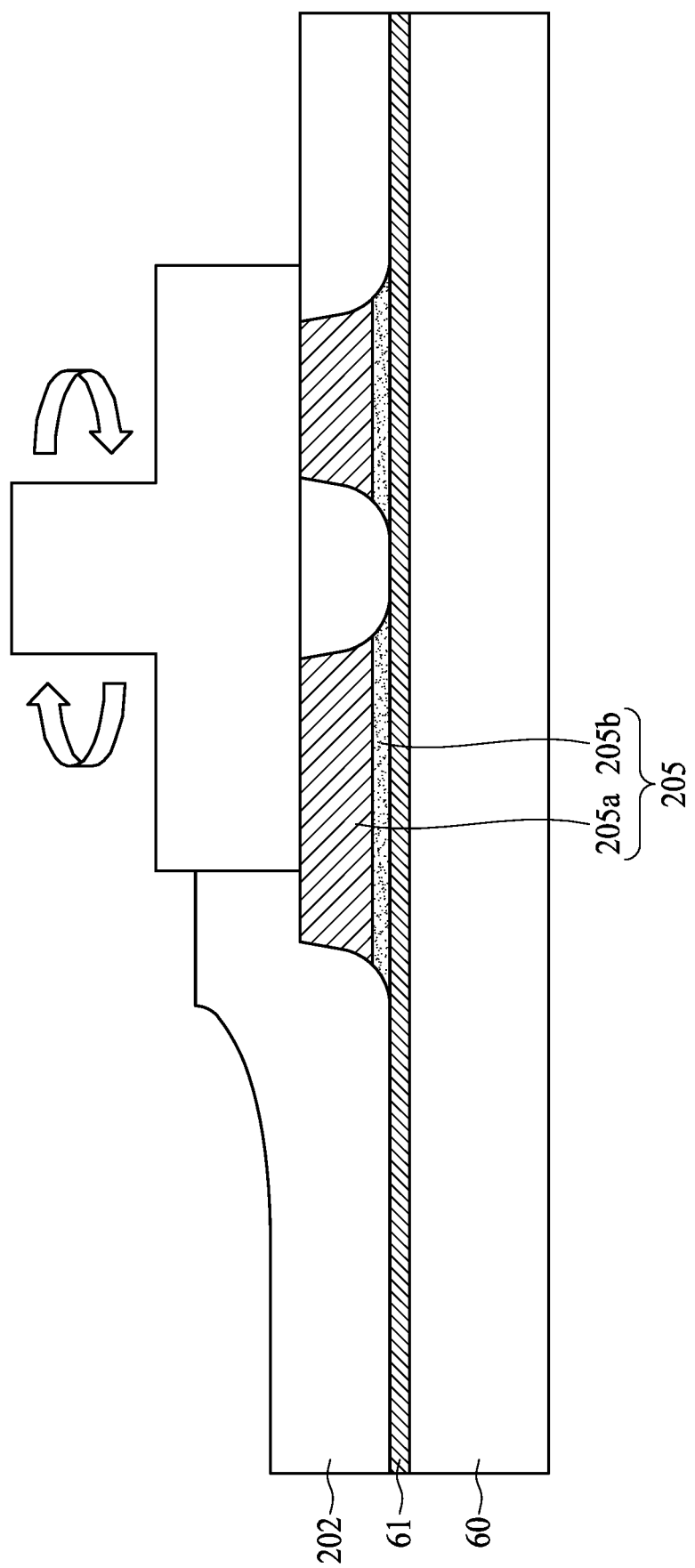

Referring to FIG. 6E, the dielectric layer 202 is planarized by a grinding operation to expose a top surface of the conductive layer 205a, The planarized surface of the dielectric layer 202 is then ready for subsequent routing operations.

Figure 6F:
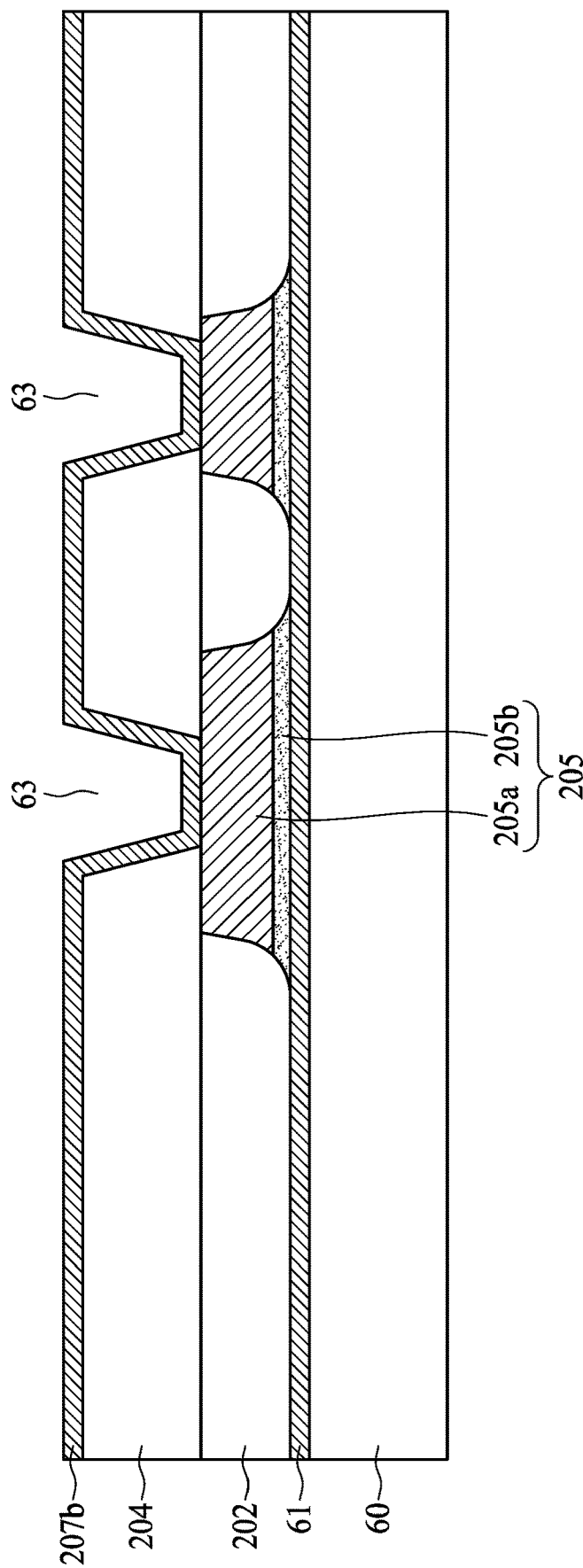

Referring to FIG. 6F, a dielectric layer 204 is disposed on the grinded dielectric layer 202. The dielectric layer 204 is patterned to form a plurality of first openings 63. A seed layer 207b is disposed on the patterned dielectric layer 204. The seed layer 207b may include Ti/Cu.

Figure 6G:
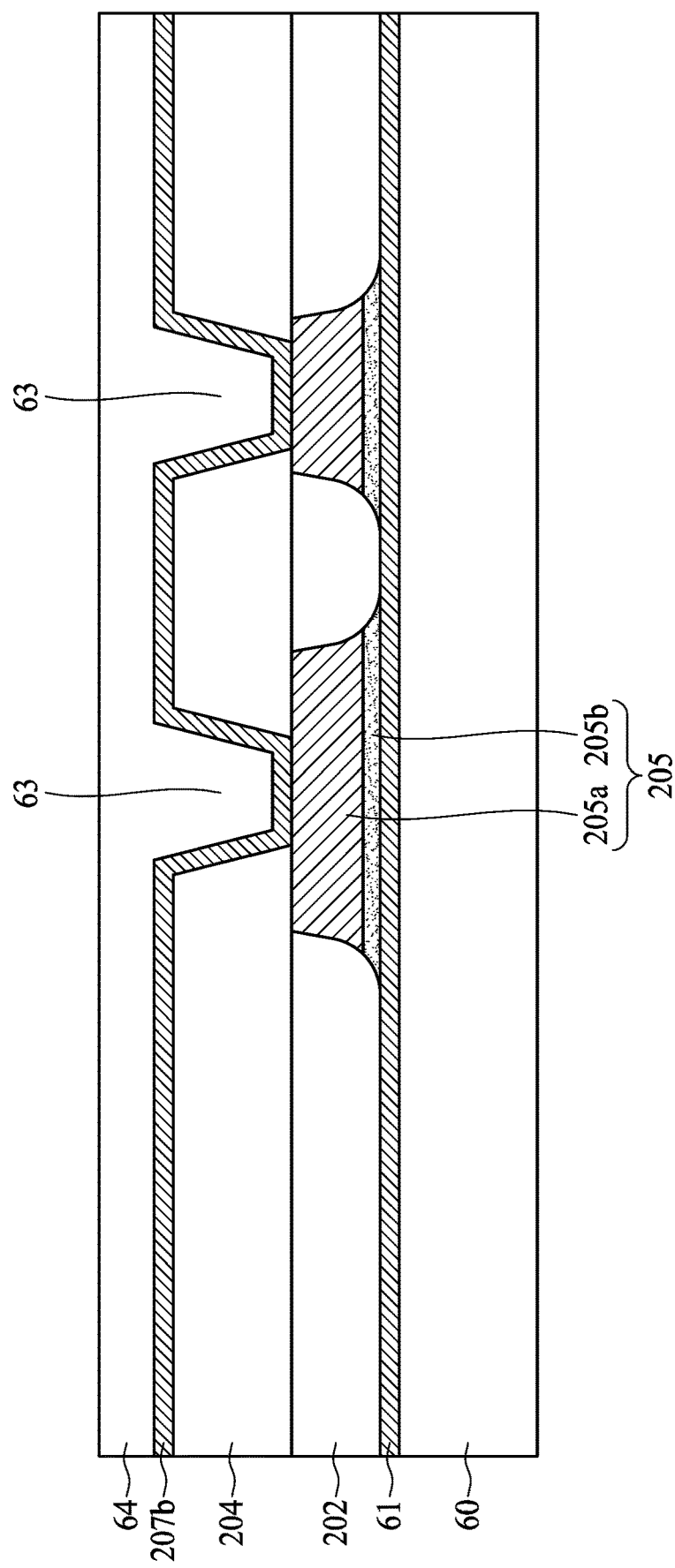

Referring to FIG. 6G, a photoresist 64 is applied on the patterned dielectric layer 204 and covering the first openings 63 formed in FIG. 6F.

Figure 6H:
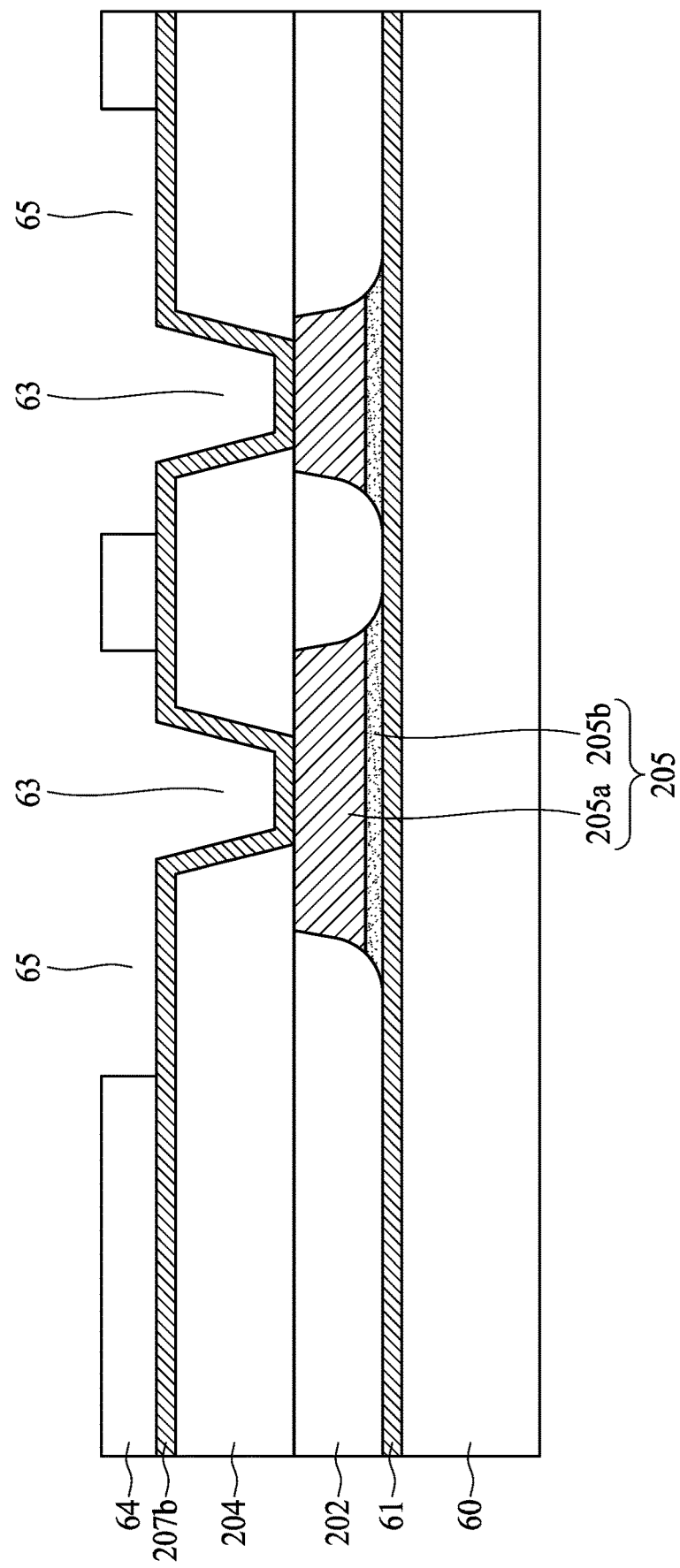

Referring to FIG. 6H, the photoresist 64 is patterned by a photolithographic operation to form a plurality of second openings 65.

Figure 6I:
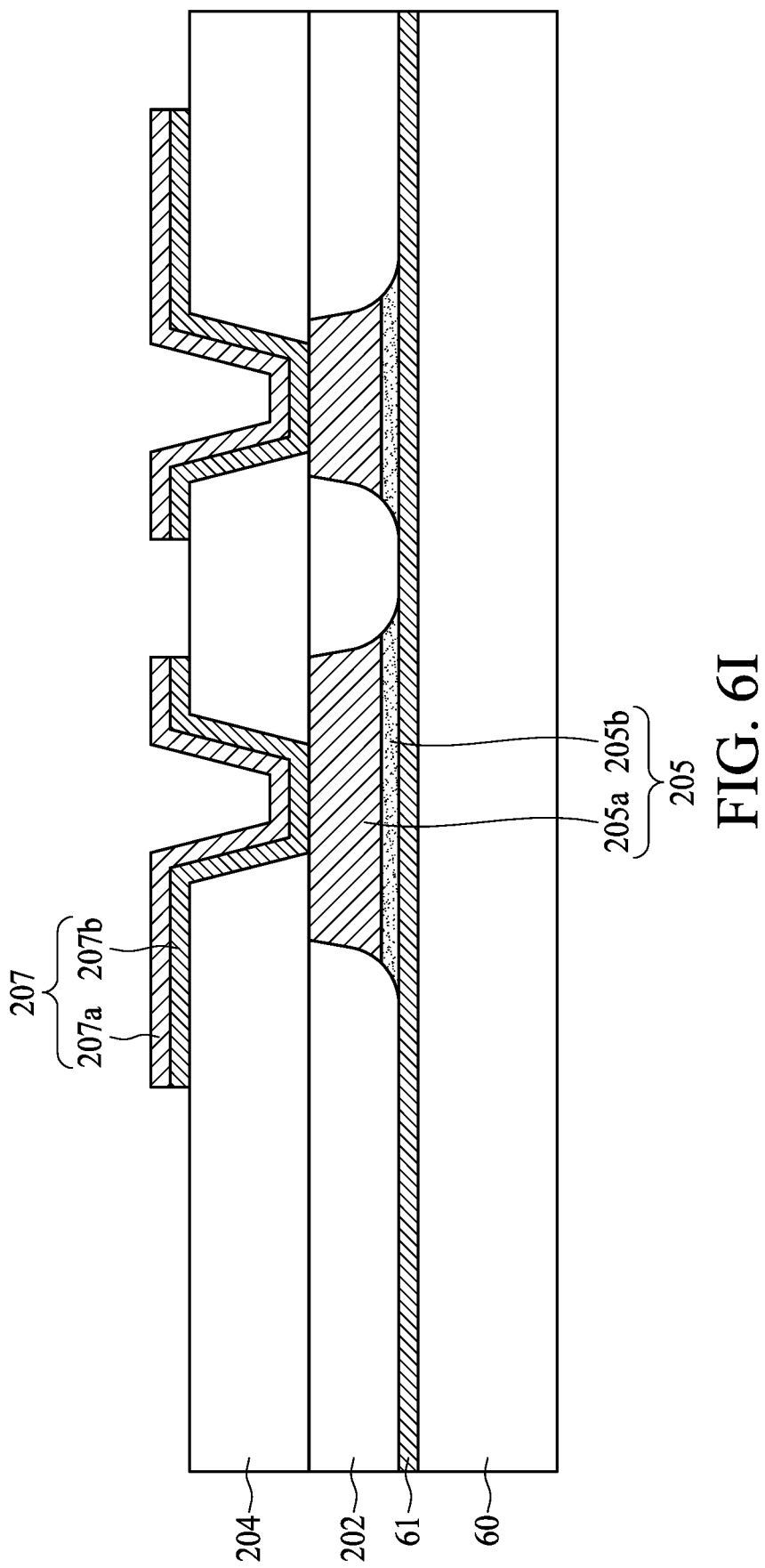

Referring to FIG. 6I, a conductive layer 207a is formed in the second openings 65 by an electroplating operation. Subsequently, the photoresist 64 is removed. Then, the conductive layer 207a and the seed layer 207b are etched by an etching operation to form an interconnection element 207.

Figure 6J:
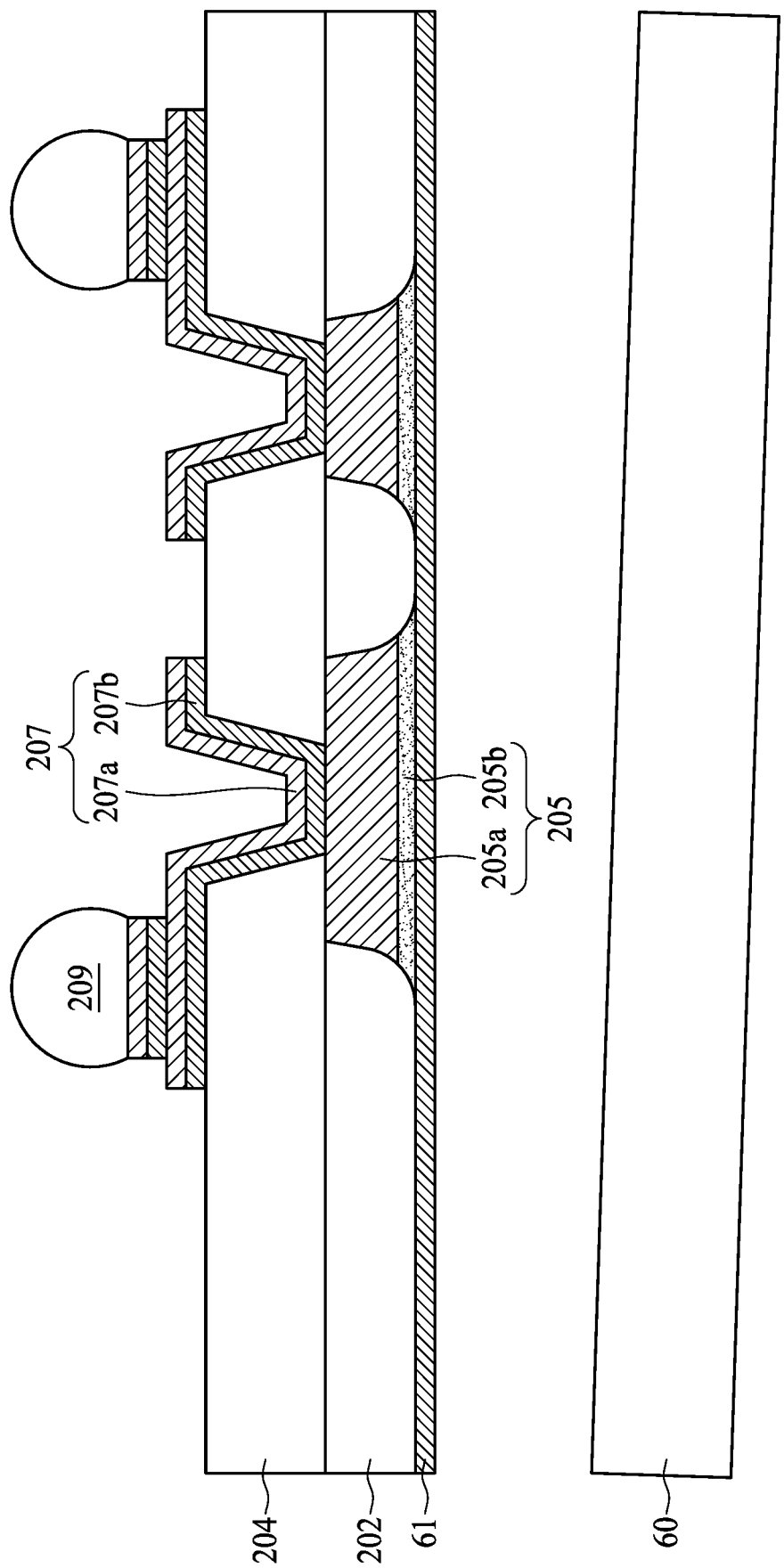

Referring to FIG. 6J, a solder ball 209 is disposed on the interconnection element 207. The solder ball 209 is electrically connected to the conductive pattern 205 through the interconnection element 207. Subsequently, the carrier 60 is removed.

Figure 6K:
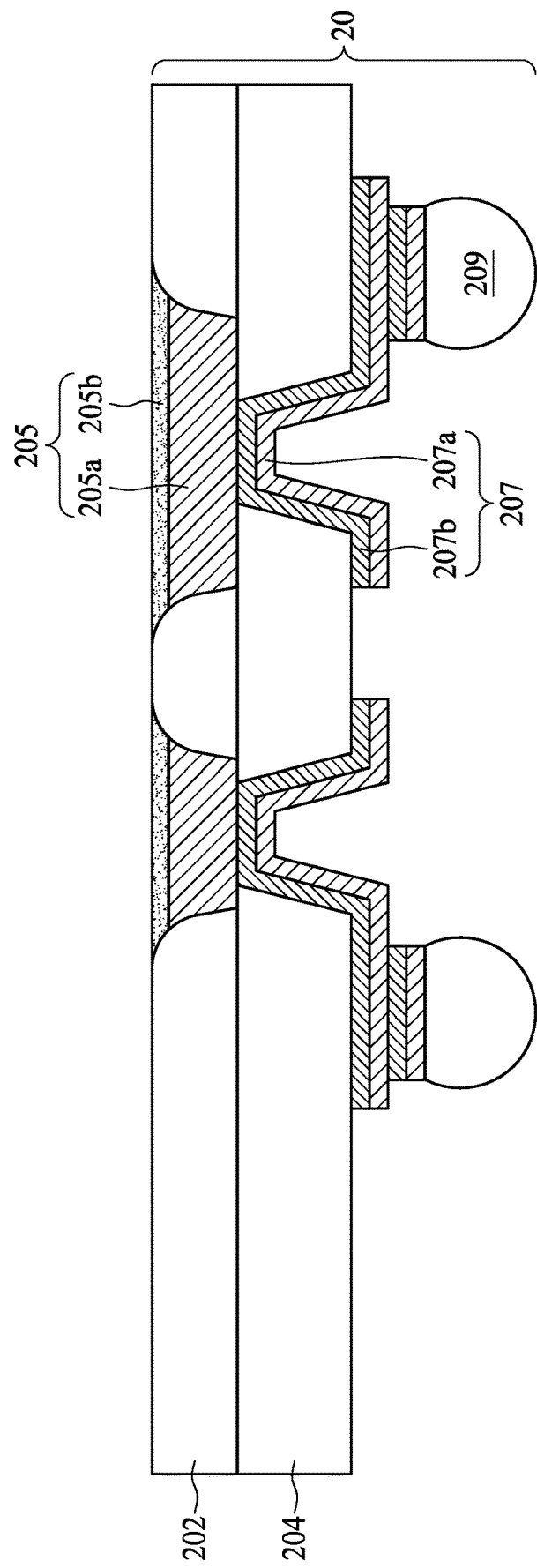

Referring to FIG. 6K, the adhesive layer 61 is removed to form the package substrate 20.

FIG. 7A through FIG. 7H illustrate some embodiments of a method of manufacturing a semiconductor package structure 1 according to some embodiments of the present disclosure. Various figures have been simplified to more clearly present aspects of the present disclosure.

Figure 7A:
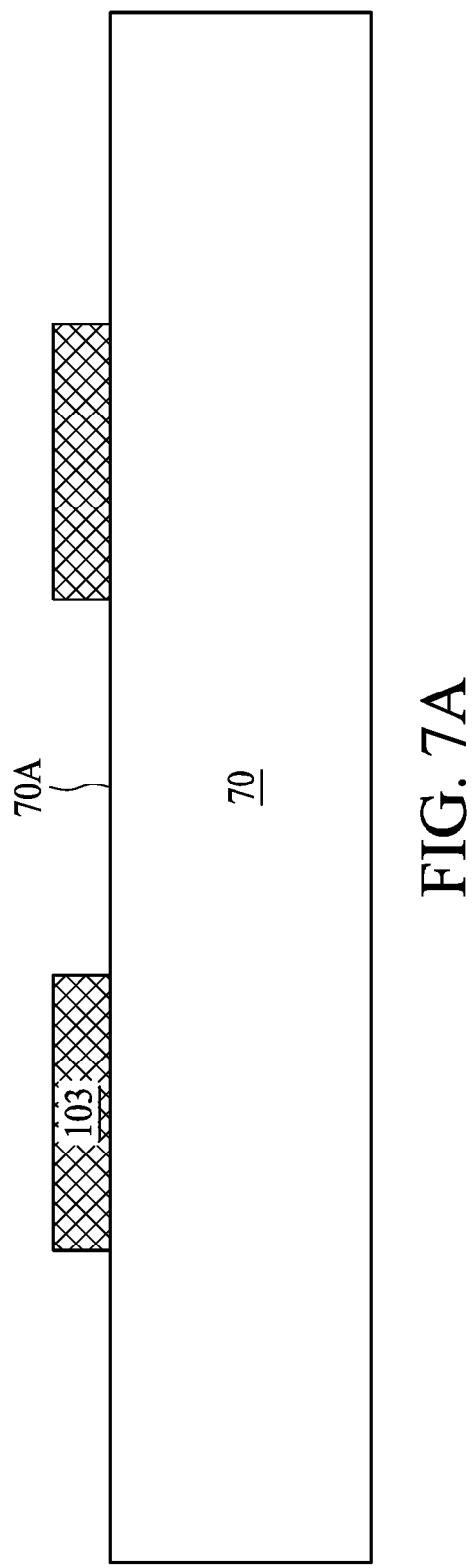
FIG. 7A, FIG. 7B, FIG. 7C, FIG. 7D, FIG. 7E, FIG. 7F, FIG. 7G, and FIG. 7H illustrate intermediate operations of a method for manufacturing a semiconductor package structure according to some embodiments of the present disclosure.

Referring to FIG. 7A, the method for manufacturing the semiconductor package structure 1 includes providing a semiconductor wafer 70 with an active surface 70A. The semiconductor wafer 70 includes a conductive pad 103 in proximity to, adjacent to, or embedded in and exposed at the active surface 70A. The conductive pad 103 may be formed/patterned by an etching operation on the active surface of the semiconductor wafer 70.

Figure 7B:
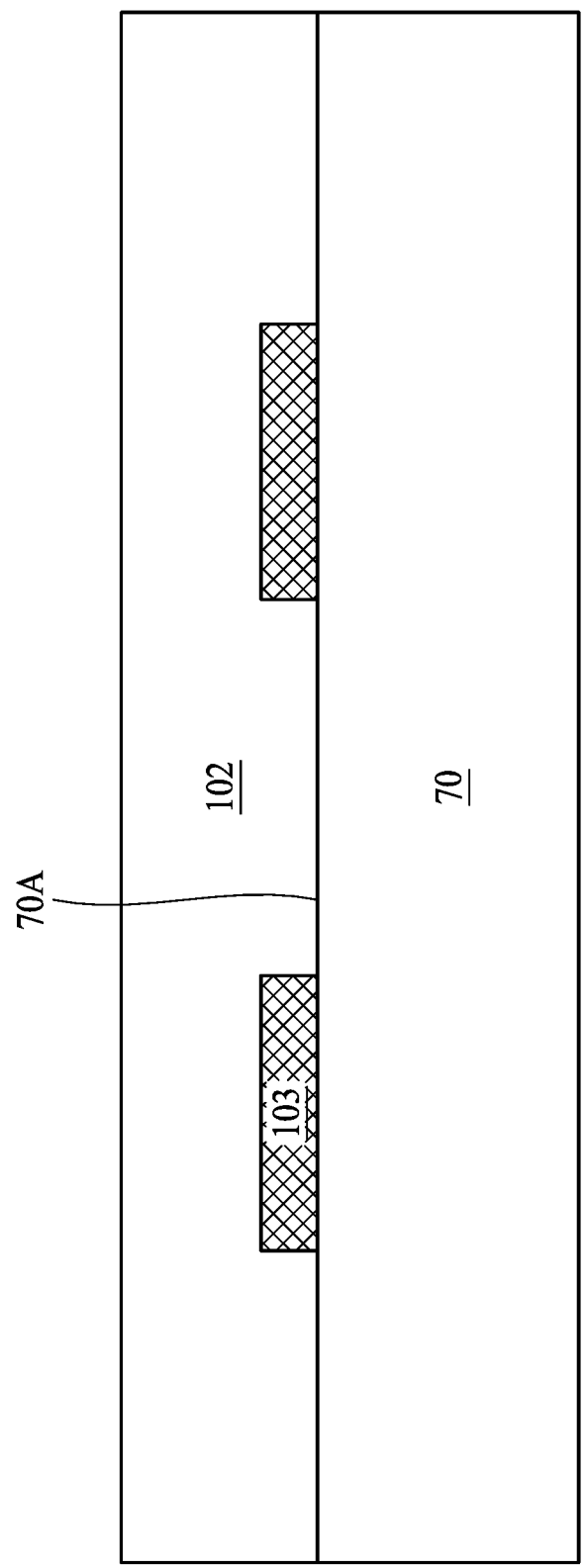

Referring to FIG. 7B, a dielectric layer 102 is disposed on the active surface of the semiconductor wafer 70. The dielectric layer 102 may include an inorganic material (such as silicon oxide) or an organic material.

Figure 7C:
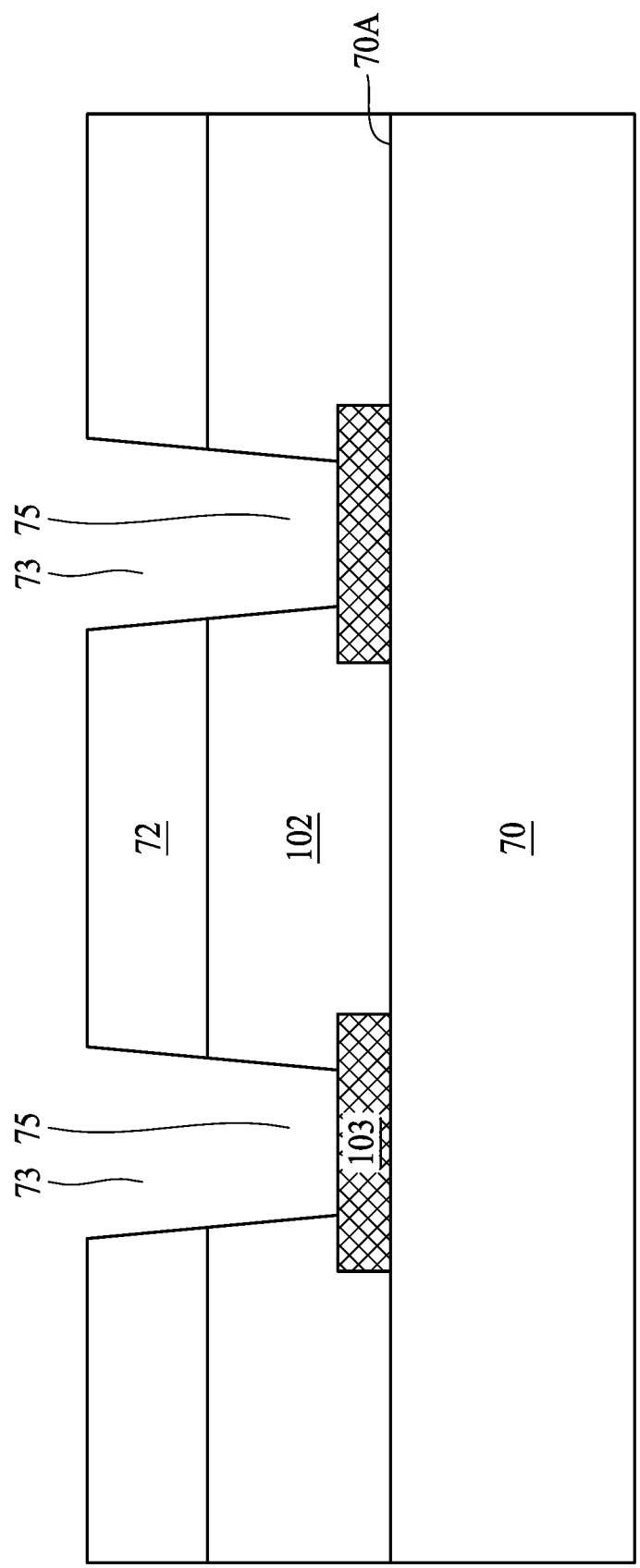

Referring to FIG. 7C, a photoresist 72 is applied on the dielectric layer 102. Then, the photoresist 72 is patterned by a photolithographic operation to form a plurality of third openings 73. Subsequently, the dielectric layer 102 is patterned by an etching operation to form a plurality of fourth openings 75 underlying the third openings 73. The conductive pad 103 is partially exposed by the third and the fourth openings 73, 75. A portion of the conductive pad 103 is exposed by a lithography operation.

Figure 7D:
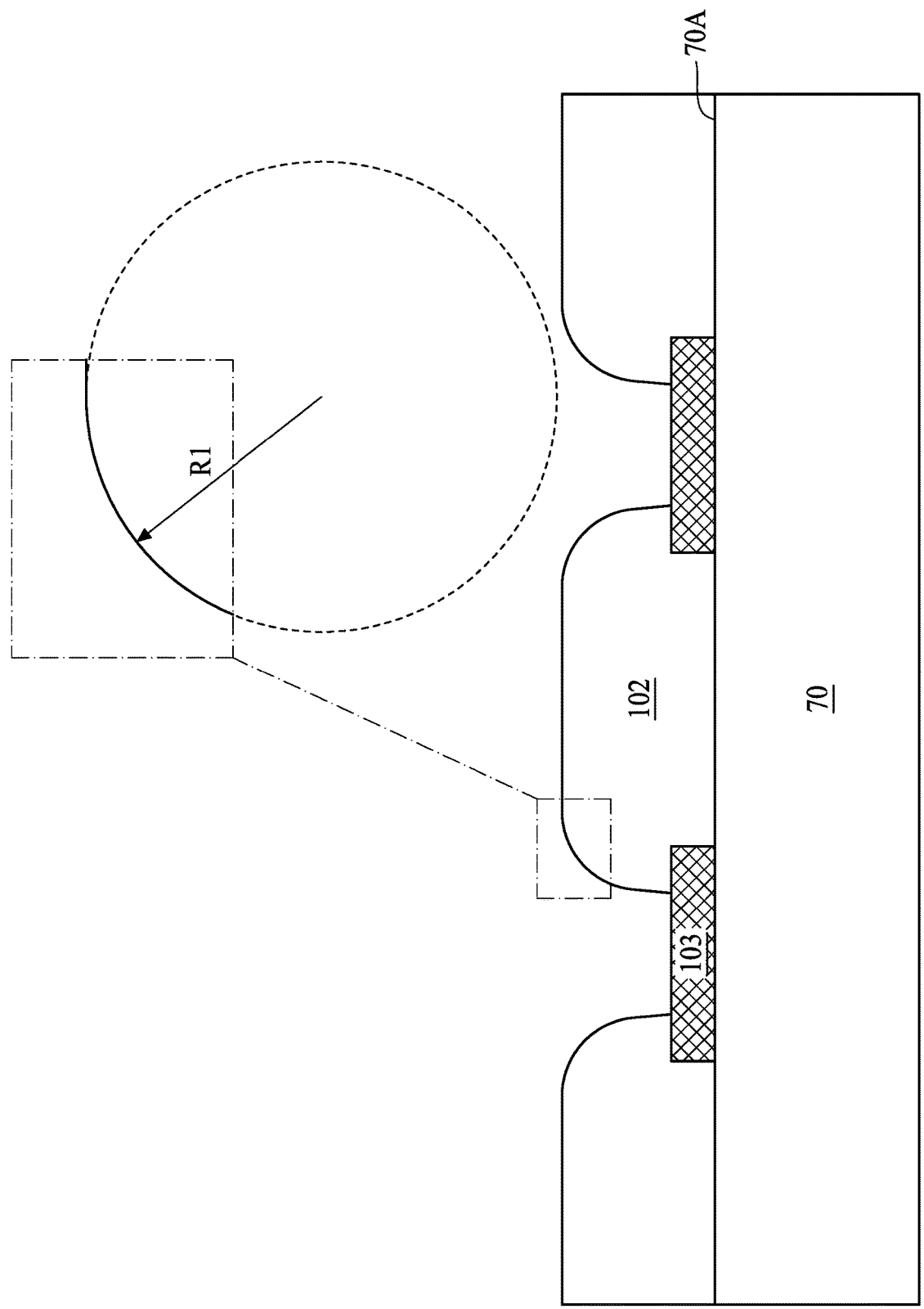

Referring to FIG. 7D, the dielectric layer 102 is trimmed by an etching operation to form a radius of curvature R1 in proximity to a surface of the dielectric layer 102 distal to the active surface of the semiconductor wafer 70. In some embodiments, etching recipe used in the etching operation may be adjusted to form different radius of curvature at the sidewall of the dielectric layer 102. For example, when 25 minutes, a greater radius of curvature 1.75 μm can be obtained. When 1 minute, a smaller radius of curvature 0.52 μm can be obtained.

Figure 7E:
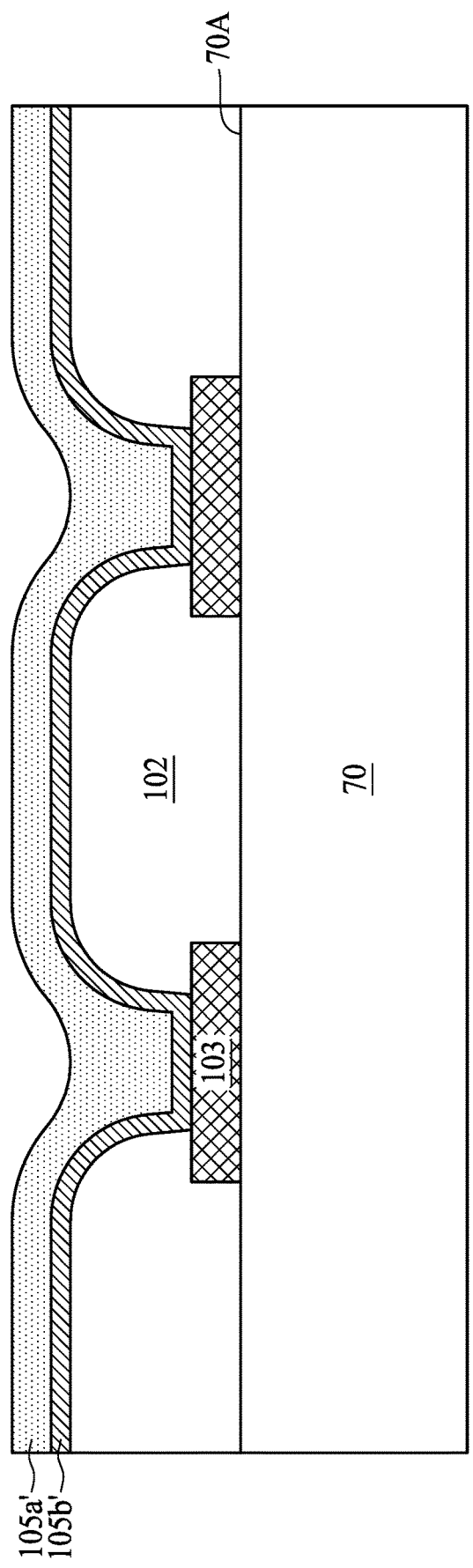

Referring to FIG. 7E, a seed layer 105b' is formed on the dielectric layer 102. Subsequently, a bonding layer 105a' is formed on the seed layer 105b'. The bonding layer 105a' and the seed layer 105b' are surrounded by the dielectric layer 102. The bonding layer 105a' may include copper with finer grains than that at the seed layer 105b'. The bonding layer 105a' may be formed by a PVD operation, such as a sputtering operation. In some embodiments, the bonding layer 105b' may be formed by a plating operation or a printing operation.

Figure 7F:
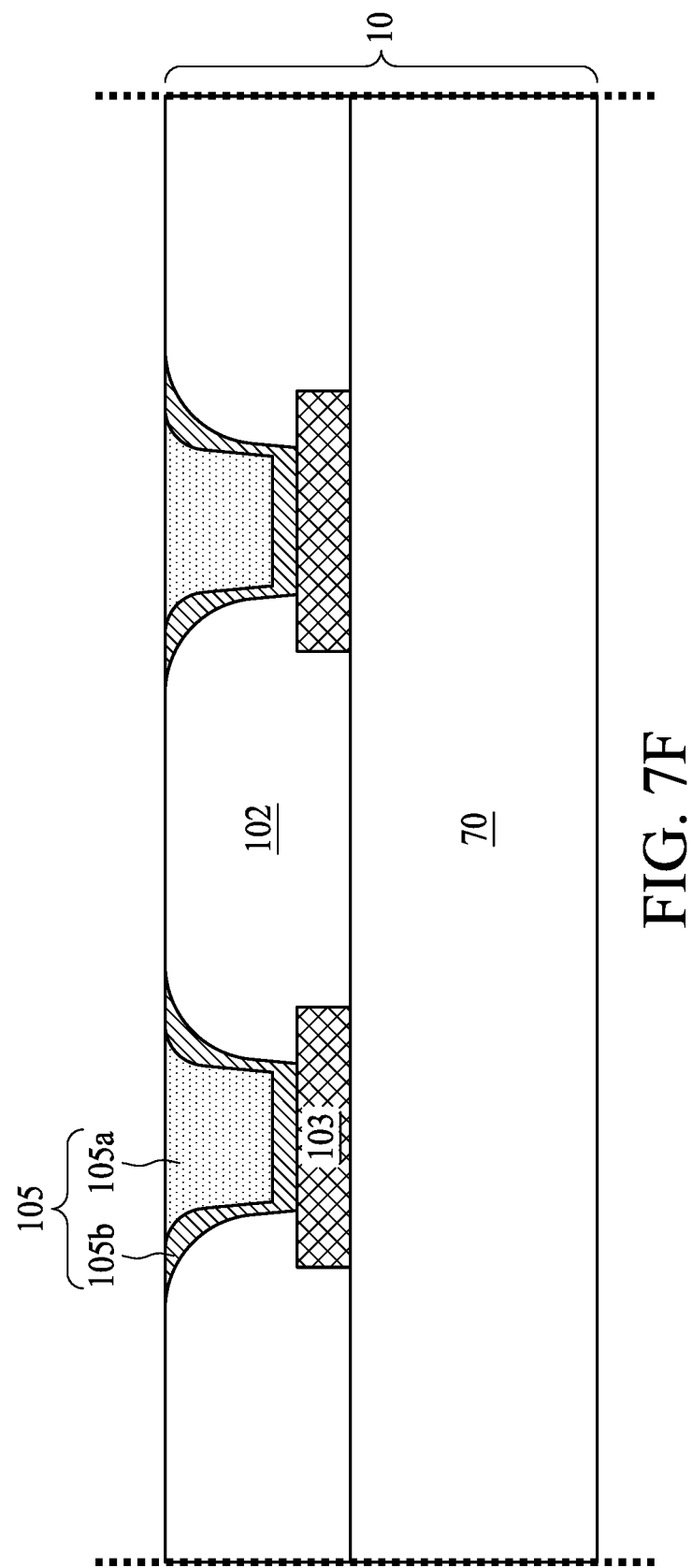

Referring to FIG. 7F, a planarization operation is performed to remove a portion fan-out the bonding layer 105a' and a portion of the seed layer 105b' in order to obtain a conducive pattern 105 with a bonding layer 105a and a seed layer 105b. Subsequently, the semiconductor wafer 70 is divided into a plurality of semiconductor dies 101 by a dicing operation. After the dicing operation, a semiconductor package structure 10 is completed.

Figure 7G:
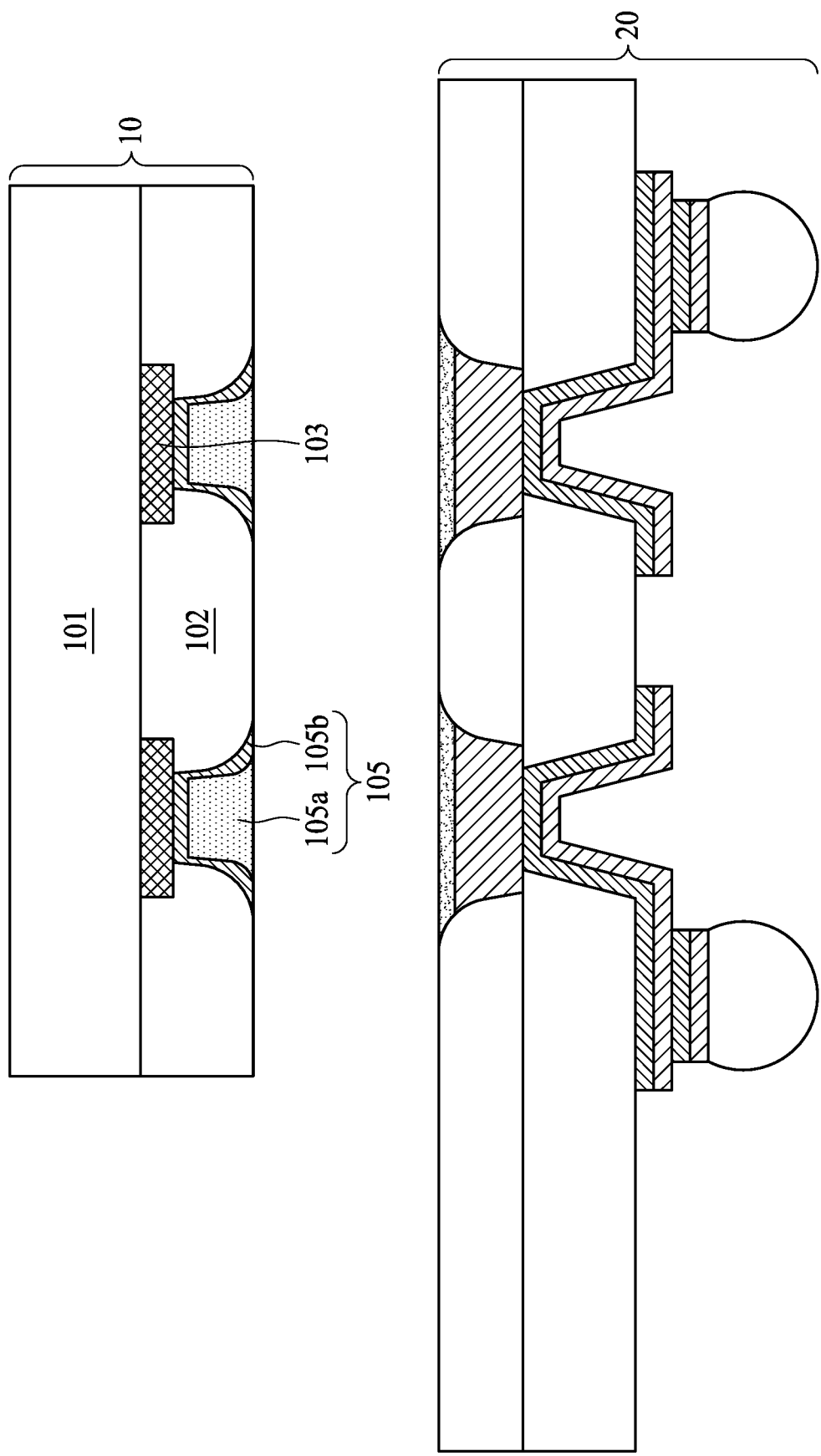

Referring to FIG. 7G, the semiconductor package structure 10 is disposed on the package substrate 20. The conducive pattern 105 of the semiconductor package structure 10 is bonded to the conducive pattern 205 of the package substrate 20. In some embodiments, an ultrasonic operation is applied when bonding the semiconductor package structure 10 with the package substrate 20. For example, a bonding head may hold the semiconductor package structure 10 and exerting a horizontal force thereon. Lateral rubbing between the bonding layer 105a and the bonding layer 205b may foster the metal-metal connection in the hybrid bonding operation. Moreover, due to the curved interface at the conducive pattern 105 and the conducive pattern 205, the horizontal force exerted by the bonding head can be dispersed so as to avoid crack and delamination. In some embodiments, one of the conducive pattern 105 or the conducive pattern 205 possesses a curved interface.

Figure 7H:
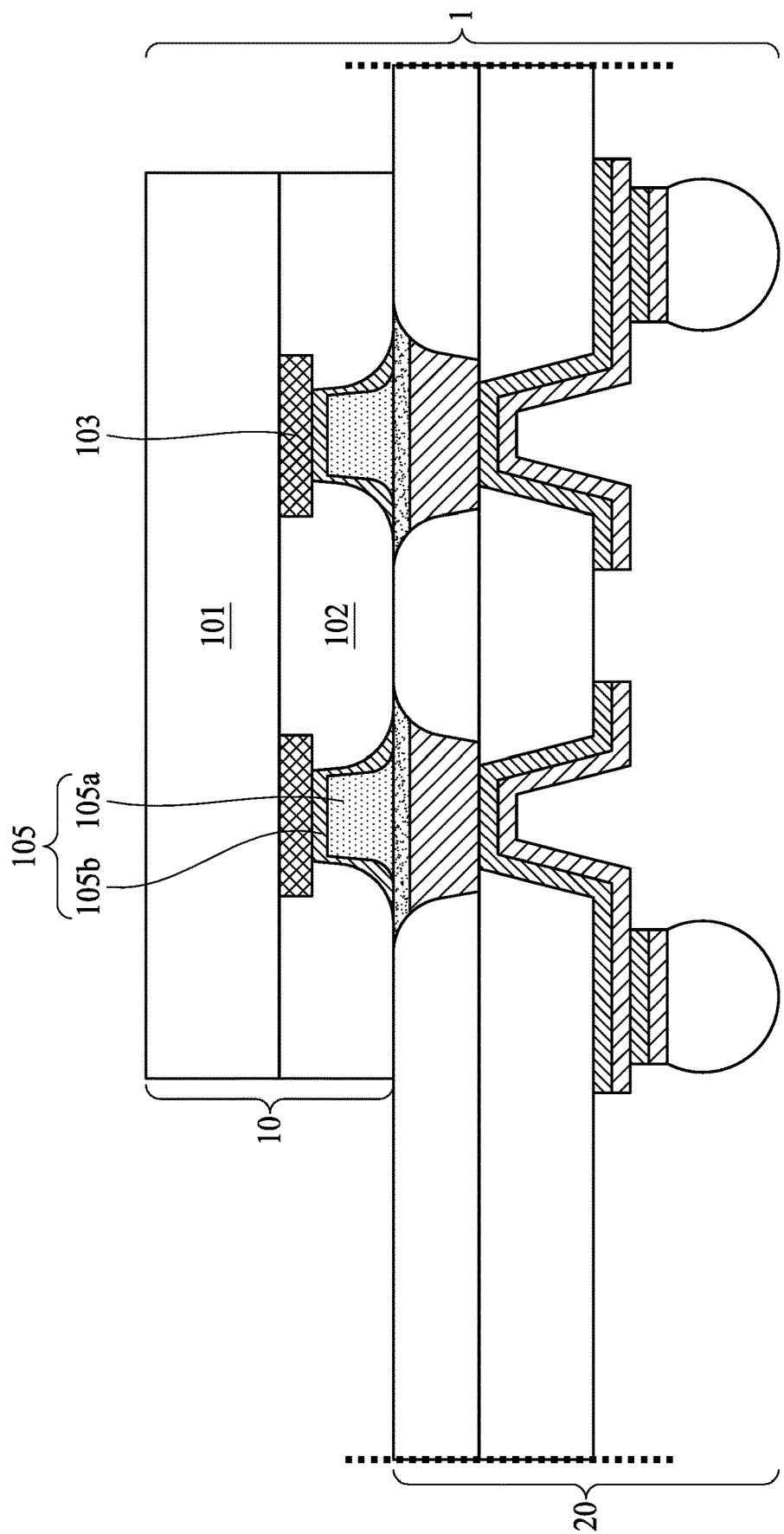

Referring to FIG. 7H, a singulation operation is performed on the package substrate 20 to form the semiconductor package structure 1.

As used herein, spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   a semiconductor die having an active surface, the semiconductor die comprising:
      a first conductive bump electrically coupled to the active surface;
      a first dielectric layer surrounding the first conductive bump, a distal end of the first conductive bump is wider than a proximal end of the conductive bump with respect to the active surface;
   a substrate having a bonding surface, the substrate comprising:
      a second conductive bump including a curved side wall and connected to the first conductive bump at the bonding surface;
      a second dielectric layer surrounding the second conductive bump, a distal end of the second conductive bump is narrower than a proximal end of the second conductive bump with respect to the bonding surface,
   wherein the first dielectric layer is in contact with the second dielectric layer.

2. The semiconductor package structure of claim 1, wherein a width of the first conductive bump at the distal end of the first conductive bump is narrower than a width of the second conductive bump at the proximal end of the second conductive bump.

3. The semiconductor package structure of claim 1, wherein the substrate further comprising a conductive terminal surface opposite to the bonding surface.

4. The semiconductor package structure of claim 1, wherein the second conductive bump comprises a first layer in proximity to the proximal end of the second conductive bump and a second layer in proximity to the distal end of the second conductive bump, wherein the first layer is in contact with the first conductive bump and the first dielectric layer.

5. The semiconductor package structure of claim 4, wherein the first layer is a bonding layer.

6. The semiconductor package structure of claim 5, wherein the bonding layer includes nano-copper.

7. The semiconductor package structure of claim 1, wherein a boundary of the first conductive bump and the first dielectric layer at the distal end of the first conductive bump comprises a first radius of curvature.

8. The semiconductor package structure of claim 7, wherein a boundary of the second conductive bump and the second dielectric layer at the proximal end of the second conductive bump comprises a second radius of curvature.

* * * * *